United States Patent
Lamey et al.

(10) Patent No.: US 8,537,512 B2
(45) Date of Patent: Sep. 17, 2013

(54) ESD PROTECTION USING ISOLATED DIODES

(75) Inventors: Daniel J. Lamey, Phoenix, AZ (US); David C. Burdeaux, Tempe, AZ (US); Olivier Lembeye, Saint Lys (FR)

(73) Assignee: Freescale Semiconductor, Inc., Austin, TX (US)

( * ) Notice: Subject to any disclaimer, the term of this patent is extended or adjusted under 35 U.S.C. 154(b) by 673 days.

(21) Appl. No.: 12/393,166

(22) Filed: Feb. 26, 2009

(65) Prior Publication Data

US 2010/0214704 A1 Aug. 26, 2010

(51) Int. Cl.
*H02H 9/00* (2006.01)

(52) U.S. Cl.
USPC .......................................... 361/56; 361/111

(58) Field of Classification Search
USPC .................................... 361/56, 111
See application file for complete search history.

(56) References Cited

U.S. PATENT DOCUMENTS

| | | | |
|---|---|---|---|
| 5,243,234 A | 9/1993 | Lin et al. | |
| 5,287,241 A | 2/1994 | Puar | |
| 5,578,860 A | 11/1996 | Costa et al. | |
| 5,811,857 A | 9/1998 | Assaderaghi et al. | |
| 6,015,992 A | 1/2000 | Chatterjee et al. | |
| 6,034,397 A | 3/2000 | Voldman | |
| 6,060,752 A | 5/2000 | Williams | |
| 6,064,249 A | 5/2000 | Duvvury et al. | |
| 6,222,236 B1 | 4/2001 | Lamey | |
| 6,229,180 B1 | 5/2001 | Yoshida et al. | |
| 6,259,139 B1 | 7/2001 | Pan | |
| 6,262,454 B1 * | 7/2001 | Legnani et al. | 257/355 |
| 6,344,385 B1 | 2/2002 | Jun et al. | |
| 6,455,902 B1 | 9/2002 | Voldman | |
| 6,645,820 B1 | 11/2003 | Peng et al. | |
| 6,670,834 B1 | 12/2003 | Swanson | |
| 6,674,129 B1 | 1/2004 | Colclaser et al. | |
| 7,064,353 B2 | 6/2006 | Bhat | |
| 7,280,332 B2 | 10/2007 | Ma et al. | |
| 7,294,542 B2 * | 11/2007 | Okushima | 438/199 |
| 7,408,752 B2 | 8/2008 | Ma et al. | |
| 7,599,160 B2 * | 10/2009 | Jou et al. | 361/56 |
| 7,666,723 B2 * | 2/2010 | Frank et al. | 438/155 |
| 2002/0109189 A1 * | 8/2002 | Chen et al. | 257/350 |
| 2005/0110060 A1 | 5/2005 | Shiu et al. | |
| 2007/0228475 A1 | 10/2007 | Burdeaux et al. | |
| 2008/0133203 A1 * | 6/2008 | Yang et al. | 703/14 |

FOREIGN PATENT DOCUMENTS

WO 2007/112770 A1 10/2007

* cited by examiner

*Primary Examiner* — Rexford Barnie
*Assistant Examiner* — Tien Mai
(74) *Attorney, Agent, or Firm* — Sherry W. Schumm

(57) ABSTRACT

An electrostatic discharge (ESD) protection circuit (40) is coupled across input-output (I/O) pads (21) and common terminals (24) of a core circuit (22) to protect it from ESD events. The circuit (40) comprises, a unidirectional ESD clamp (23) and two or more floating diodes (42, 44) arranged in parallel opposed configuration in series with the ESD clamp (23), the combination coupled between the I/O pads (21) and the reference terminals (24). In a preferred arrangement, the two strings of opposed parallel coupled diodes (42, 44) are used with different numbers of diodes in each string. These diodes (42, 44) operate in forward conduction (43, 45), so the energy dissipated therein during an ESD event is much reduced compared to a reverse biased diode and they can have smaller area. Signal clipping at the I/O pad (21) is reduced, less power is dissipated and less chip area is utilized.

18 Claims, 4 Drawing Sheets

ESD PROTECTION USING ISOLATED DIODES

FIELD OF THE INVENTION

The present invention generally relates to electrostatic discharge (ESD) protection of electronic elements and, more particularly, ESD protection of semiconductor components and integrated circuits.

BACKGROUND OF THE INVENTION

Modern electronic devices, especially semiconductor (SC) devices and integrated circuits (ICs) are at risk of damage due to electrostatic discharge (ESD) events. It is well known that electrostatic discharge from handling SC devices and ICs, by humans or machines or both, is a source of such excess voltage. Accordingly, it is commonplace to provide an ESD clamp (voltage limiting device) across the input/output (I/O) and other terminals of such SC devices and IC's.

FIG. 1 is a simplified schematic diagram of circuit 20 according to the prior art, wherein ESD clamp 23 is placed between input/output (I/O) terminal or pad 21 and ground or common terminal 24 of a SC device or IC to protect device(s) or IC 22 (the "protected core") that is also coupled typically to I/O terminal or pad 21 and common (e.g., "GND") terminal 24. As used herein, the abbreviation "GND" is intended to refer to the common or reference terminal of a particular circuit or electronic element, irrespective of whether it is actually coupled to an earth return, and the abbreviation "I/O" is intended to include any external terminal other than "GND" and the legend "protected core" is intended to include any individual device or collection of devices or electronic elements, such as are found for example (and not intended to be limiting) in integrated circuits (ICs) and RF amplifiers.

Zener diode symbol 23' within ESD clamp 23 indicates that the function of ESD clamp 23 is to limit the voltage than can appear across protected core 22 irrespective of the voltage applied between I/O pad 21 and GND or reference terminal 24. It should be understood that ESD clamp 23 is not limited to Zener diodes but can include any combination of devices that switches ON at a predetermined voltage V sufficiently low to protect circuit core 22 from an ESD or other excess voltage event and that remains substantially OFF at voltages below V so as to not interfere with normal operation of protected core 22 of circuit 20. As indicated by Zener diode symbol 23', ESD clamp 23 is an asymmetric or unidirectional clamp, that is, the voltages at which it conducts (turns-ON) are significantly different for the two polarities of applied voltage, hence the designation "asymmetric". In its simplest form, ESD clamp 23 can go into forward conduction at a low voltage $V=V_f$ (e.g., where $|V_f| \sim 1$ volt or less) of a first polarity and for the opposite (reverse) polarity remain OFF until a significantly larger breakdown voltage $V=V_{BD}$ is reached, when it then turns ON to sink an ESD event of that polarity. Below $|V| \sim |V_{BD}|$, such device is essentially a unidirectional device, being conductive for one polarity and non-conductive for the opposite polarity.

FIG. 2 shows current-voltage plot 28, wherein trace 20' illustrates current 25 (see FIG. 1) flowing through ESD clamp 23 as function of the voltage applied between pad 21 and GND or reference terminal 24. The identification of positive (+) and negative (−) voltage refers to the polarity of voltage applied to I/O pad 21 with respect to terminal 24. In region 27 of plot 28 where positive (+) voltage is applied to I/O pad 21, ESD clamp 23 is reverse biased and does not conduct significantly until voltage $V=+V_1$ is reached, whereupon it turns ON so as to shunt current 25 caused by any excess ESD voltage to terminal 24. In region 29 of plot 28, ESD clamp 23 is forward biased and goes into forward conduction at voltage $V=-V_2$ determined generally by the band-gap of the SC material of which it is formed. As illustrated in FIG. 2, the magnitude of forward voltage drop $V_2$ is usually small compared to the magnitude of reverse breakdown voltage $V_1$ and is typically of the order of about a volt or less.

A problem with the circuit of FIG. 1 is that if the signal(s) being applied to I/O pad 21 go negative with respect to reference terminal 24, they can be clipped by ESD clamp 23. This is undesirable, especially in connection with analog circuitry where both positive and negative going signals are routinely encountered. The problem can be especially troublesome in connection with RF power amplifiers, which are much used in modern day communication systems. While symmetrical ESD clamps are known, that is, ESD clamps that turn on at voltages of the order of, say, V1 in either polarity, such symmetrical ESD clamps are sometimes difficult or impossible to fabricate in connection with certain types of protected devices or circuits (e.g., protected core 22) because the available fabrication steps or technology do not lend themselves to providing the specific device regions needed to form conventional symmetrical ESD clamps and modification of the manufacturing process to accommodate formation of symmetrical ESD devices may be undesirably expensive. Thus, a need continues to exist for ESD clamps that avoid the signal clipping problems associated with prior art ESD clamps of the type illustrated in FIG. 1 and that are compatible with the fabrication technology available for forming the protected devices or ICs (e.g., protected core 22), even though they may not be well suited to formation of conventional symmetrical ESD clamps. A further important consideration is providing suitable ESD clamps, clamp circuits and systems that occupy minimum SC area so as to not increase the manufacturing cost of the overall device or IC of which the ESD system is a part. It is well known that the cost of SC components and ICs increases as the chip area they occupy increases.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
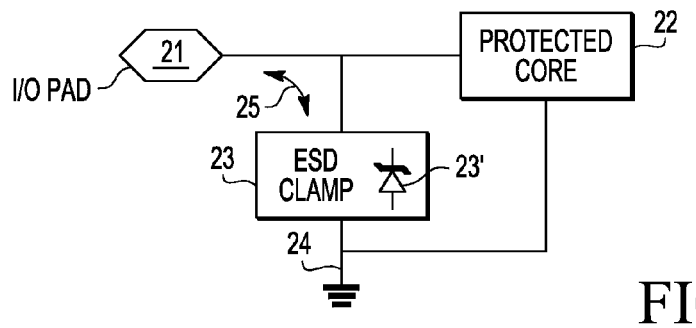
FIG. 1 is a simplified schematic diagram of a prior art ESD protection circuit using an ESD clamp to protect a device or circuit core from ESD events.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

Figure 3:
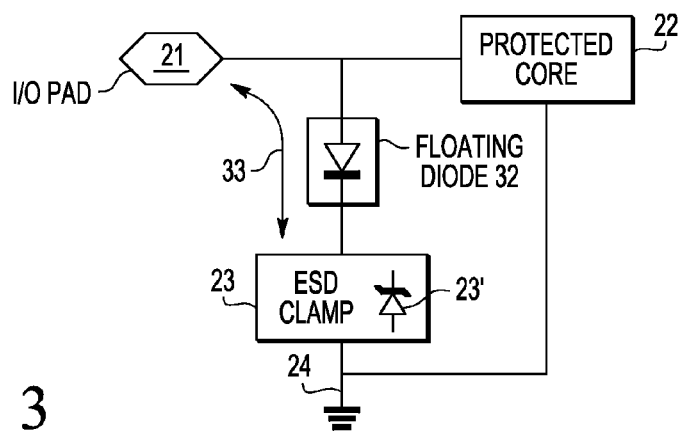
FIG. 3 is a simplified schematic diagram of an ESD protection circuit using an ESD clamp in cooperation with an isolated (floating) diode to protect a device or circuit core from ESD events.
Figure 6:
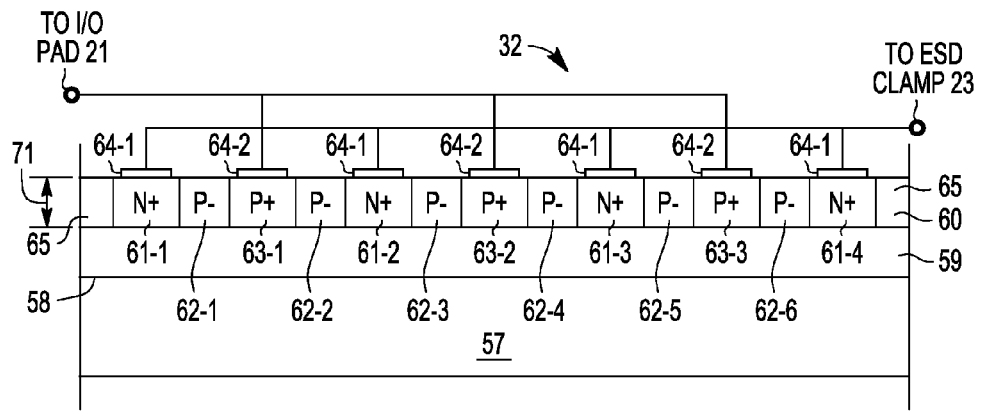
FIG. 6 is a simplified schematic cross-sectional view of a floating diode such as is used in connection with the circuit of FIG. 3.
Figure 7:
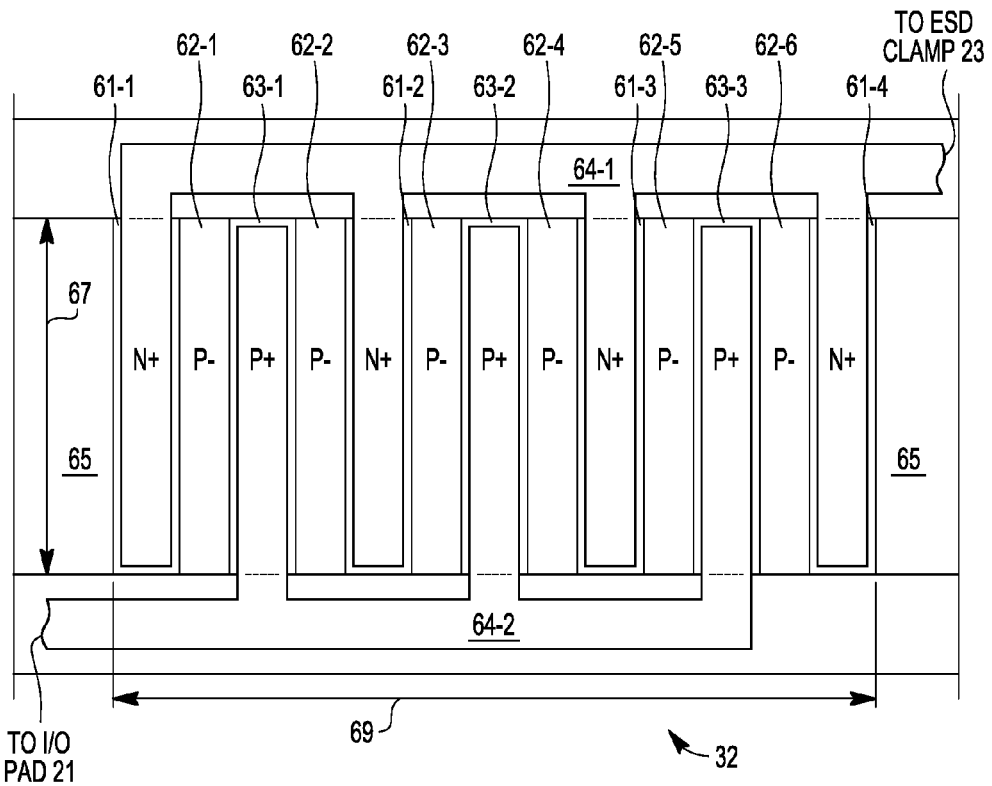
FIG. 7 is a simplified schematic plan view of the floating diode of FIG. 6.

FIG. 3 is a simplified schematic diagram of ESD protection circuit 30 using ESD clamp 23 combined with floating (isolated) diode 32 to protect device or circuit core 22 from electrostatic discharge (ESD) events. The arrangement illustrated in FIGS. 3 and 6-7 is described in more detail in co-pending, commonly owned United States patent application identified by publication number US 2007/0228475 A1, filed Mar. 28, 2007. As noted above in connection with the discussion of FIG. 1 and Zener diode symbol 23', ESD clamp 23 is an asymmetric or unidirectional clamp. Floating diode 32 is placed in series with ESD clamp 23 between I/O pad 21 and ground or reference terminal 24. When an ESD event of either polarity occurs, current 33 flows between I/O pad 21 and reference terminal 24, so as to harmlessly dissipate the ESD event without damage to core circuit 22. The polarity of diode 32 is indicated by the diode symbol included in the block representing floating diode 32 in FIG. 3.

Figure 2:
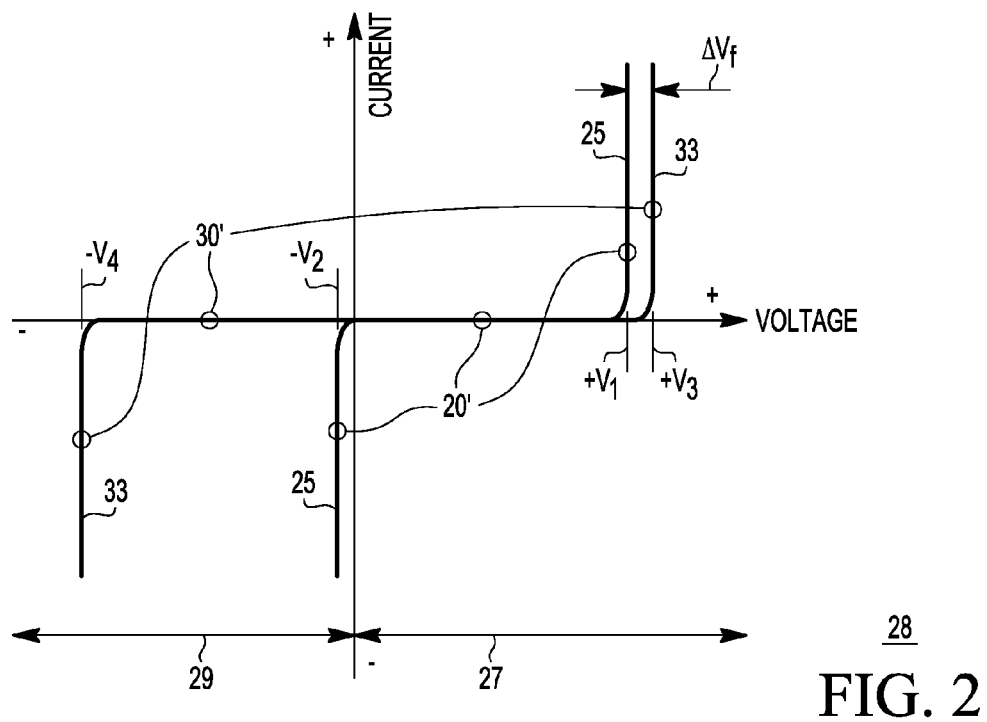
FIG. 2 is a plot showing typical current-voltage characteristic of the ESD protection circuits of FIGS. 1 and 3.

FIG. 2 shows current-voltage plot 28, wherein trace 30' illustrates current 33 (see FIG. 3) flowing through ESD clamp 23 and floating diode 32 as function of the voltage applied between I/O pad 21 and GND or reference terminal 24. The identification of positive (+) and negative (−) voltage refers to the polarity of the voltage applied to I/O pad 21 with respect to terminal 24. In circuit 30 of FIG. 3, ESD clamp 23 behaves in much the same way as in connection with circuit 20 of FIG. 1. For example, in region 27 of plot 28 where positive (+) voltage is applied to I/O pad 21, diode 32 is forward biased and ESD clamp 23 is reverse biased. In this realm of operation, ESD clamp 23 does not conduct significantly until voltage V=+$V_3$ is reached, whereupon it turns ON in the normal manner expected for ESD clamp 23 so as to shunt any excess ESD voltage to terminal 24. During that realm of operation floating diode 32 is forward biased and contributes relatively small forward voltage drop ~$\Delta V_f$, so that the turn-ON voltage observed between I/O pad 21 and terminal 24 increases by about $\Delta V_f$ from V=+$V_1$ to V=+$V_3$, where $\Delta V_f$ is the forward voltage drop of diode 32. In region 29 of plot 28, ESD clamp 23 is forward biased but floating diode 32 is reverse biased and does not begin to conduct until breakdown voltage V=−V4 is reached. By adjusting the doping and width of the various regions making up floating diode 32 (e.g., see FIGS. 6-7 and co-pending co-owned application described in publication number US 2007/0228475 A1) the magnitude of V4 can be adjusted to have the desired value to provide ESD protection to circuit core 22 for negative going events at I/O terminal 21, but otherwise remain OFF for voltages of magnitude less than $V_4$. Thus the arrangement of FIG. 3 can provide much more symmetric ESD protection and can eliminate the negative signal clipping problem associated with circuit 20 of FIG. 1.

Figure 4:
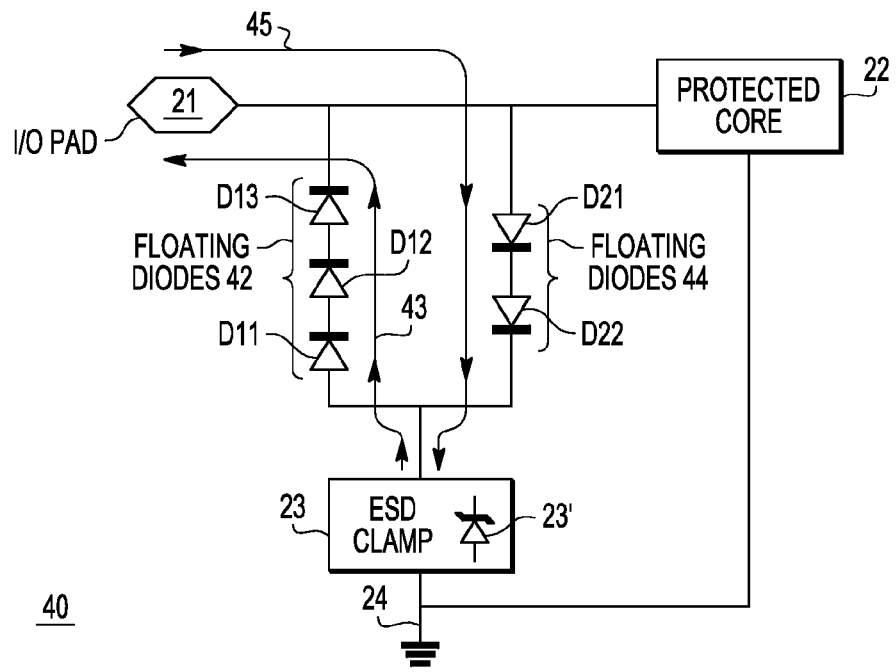
FIG. 4 is a simplified schematic diagram of an ESD protection circuit using an ESD clamp in cooperation with multiple forward biased isolated diodes to protect a device or circuit core from ESD events, according to an embodiment of the present invention.
Figure 5:
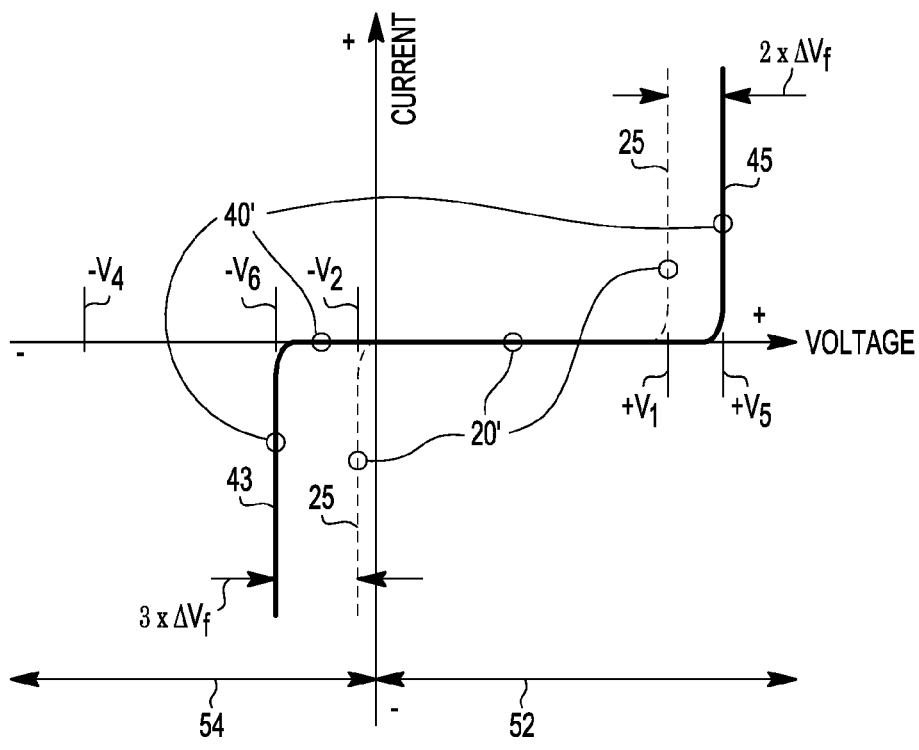
FIG. 5 is a plot showing typical current-voltage characteristic of the ESD protection circuit of FIGS. 1 and 4.

FIG. 4 is a simplified schematic diagram of ESD protection circuit 40 using ESD clamp 23 in connection with multiple floating diode strings 42, 44 to protect circuit core 22 from electrostatic discharge (ESD) events occurring between I/O pad 21 and reference terminal 24, according to an embodiment of the present invention, and FIG. 5 shows current-voltage plot 50 comparing the current-voltage characteristic of the ESD protection circuits 20 and 40 of FIGS. 1 and 4, respectively. ESD clamp 23 is a conventional asymmetric or unidirectional ESD clamp as has already been described in connection FIGS. 1-3.

Referring now to FIG. 4, series connected floating diode string 42 and series connected floating diode string 44 are coupled in parallel between I/O pad 21 and ESD clamp 23. The diodes of diode strings 42 and 44 electrically face in opposite directions so that diode string 44 conducts in the forward direction (i.e., in region 52 of FIG. 5) during a positive going ESD event on pad 21 and diode string 42 conducts in the forward direction (i.e., in region 54 of FIG. 5) in a negative-going ESD event on I/O pad 21 where, as before, positive (+) and negative (−) refer to the polarity of I/O pad 21 relative to reference terminal 24. ESD clamp 23 behaves in substantially the same manner as has already been described in connection with FIGS. 1-3. It is reverse biased in region 52 of FIG. 5 and forward biased in region 54 of FIG. 5.

In region 52 of FIG. 5 where I/O pad 21 is positive with respect to terminal 24, substantially no significant current flows through the combination of diode strings 42, 44 and ESD clamp 23 while ESD clamp 23 is still in the OFF (reverse bias) state as long as the voltage across ESD clamp 23 is less than voltage V=+$V_1$ (the breakdown voltage of ESD clamp 23). Thus, in the region where the voltage between I/O pad 21 and reference terminal 24 is less than about $V_1$, ESD circuit 40 does not interfere with operation of circuit core 22. As the voltage across ESD clamp 23 rises above $V_1$, ESD clamp 23 begins to conduct (turns ON) and the voltage across I/O pad 21 relative to reference terminal 24 is clamped at about voltage $V=+V_5$, where voltage $V_5$ is greater than voltage $+V_1$ by the forward drop associated with forward biased diodes of floating diode string 44. In this example using two diodes in diode string 44, the forward drop amounts to about $2 \times \Delta V_f$, and ESD current 45 flows through diode string 44 and ESD clamp 23 between I/O pad 21 and reference terminal 24, thereby protecting circuit core 22 during such positive going transient.

In region 54 of FIG. 5 where I/O pad 21 is negative with respect to terminal 24, forward current 43 flows through the combination of diode string 42 and ESD clamp 23. ESD clamp 23 and diode string 42 are forward biased. The negative voltage at which significant forward current 43 begins to flow changes from about $V=-V2$ to $V=-V6$ because of the addition, in this example, of about $3 \times \Delta V_f$ forward drops from the three forward biased diodes in diode string 42. In this negative polarity region, where $|V|<|V_6|$, current 43 is negligible and ESD circuit 40 does not interfere with operation of circuit core 22. As the magnitude of the negative going voltage across ESD clamp 23 and diode string 43 exceeds $|V_6|$, ESD clamp 23 and diodes 42 begin to forward conduct and substantially clamp the voltage across I/O pad 21 relative to reference terminal 24 at about voltage $V=-V_6$. By selecting the number of diodes in diode string 42, the range of negative going signals that can appear on pad 21 without being significantly clipped can be pre-determined and the clipping problems associated with circuit 20 of FIG. 1 can be avoided. In the example shown in FIG. 5 where three diodes are included in diode string 42, the clipping margin for negative going signals at pad 21 is improved by about $3 \times \Delta V_f$ from $V=-V_2$ to $V=-V_6$ volts. If N diodes are provided in diode string 42, the margin for avoiding negative going clipping at pad 21 is about $N \times \Delta V_f$ plus the value of $\Delta_f$ associated with ESD clamp 23. For many application, especially where protected core 22 is an RF power amplifier, it has been found that $1 \leq N \leq 12$ is useful, and that $2 \leq N \leq 8$ is convenient and that about $3 \leq N \leq 6$ is preferred, but other values of N may also be used depending upon the magnitude of the negative going signals appearing at I/O pad 21. Thus, $N \geq 1$ can be chosen to deal with a wide variety of negative going signal excursions at I/O pad 21.

In the example of FIG. 4, two diodes are provided in diode string 44, thereby increasing the turn-ON voltage of ESD circuit 40 by about $2 \times \Delta V_f$ from $V=+V_1$ (the turn-ON voltage of ESD clamp 23) to $V=+V_5$, where $V_5 \sim V_1 + 2 \times \Delta V_f$, but this is merely by way of example and not intended to be limiting. In further embodiments, any number M diodes may be included in diode string 44 so that $V_5 \sim V_1 + M \times \Delta V_f$. For many applications, it has been found that $1 \leq M \leq 6$ is useful, and that $1 \leq M \leq 2$ is convenient and that $M=1$ is preferred, but other values of M may also be used depending upon the magnitude of the signals and ESD events likely to appear at I/O pad 21. Thus, $M \geq 1$ can be chosen to deal with a wide variety of signal excursions at I/O pad 21, properties of ESD clamp 23 and other factors. The optimum choice of N and M will depend upon the particular characteristics of the signals appearing at I/O pad 21 for the particular circuit core 22 desired to be protected by ESD circuit 40, and can be selected by the designer based on the teachings herein.

FIG. 6 shows simplified schematic cross-sectional view 56 of floating diode 32 used in connection with circuit 30 of FIG. 3 and FIG. 7 shows simplified schematic plan view 66 of floating diode 32 of FIG. 6. Substrate 57 having upper surface 58 is provided. In many applications substrate 57 can be the SC wafer or die in and/or on which protected core 22 is being formed. Substrate 57 may be a monolithic semiconductor substrate or a layered substrate as for example and not intended to be limiting a semiconductor-on-insulator (SOI) substrate or a polycrystalline semiconductor substrate or a combination thereof. Where substrate 57 is conductive, dielectric region or layer 59 is provided on upper surface 58 so as to electrically isolate diode 32 from substrate 57. Silicon oxide is a suitable dielectric for region or layer 59 but other organic or inorganic insulating materials may also be used. Where substrate 57 is non-conductive, layer 59 may be omitted, but for convenience of explanation it is assumed hereafter to be present. Semiconductor layer 60 of thickness 71 (see FIG. 6) and width 67 (see FIG. 7) is formed on dielectric layer 59 by any convenient preparation process. Chemical vapor deposition (CVD) or plasma enhanced CVD (PECVD) are non-limiting examples of suitable processes, but molecular beam epitaxy and other deposition techniques may also be used. Poly-silicon has been found to be suitable for SC layer 60 and is preferred, but other organic and inorganic semiconductor materials, either polycrystalline or single crystalline or a combination thereof can also be used. Layer 60 is usefully initially doped in the range of about 1E16 to 1E19 $cm^{-3}$, more conveniently in the range of about 1E17 to 2E18 $cm^{-3}$ and preferably in the range of about 2E17 to 1E18 $cm^{-1}$, but lower or higher doping can also be used, the choice depending upon the electrical properties desired for diode 32. Ion implantation is a convenient doping technique, but other well known doping techniques can also be used. For purposes of illustration and not intended to be limiting, SC layer 60 is hereafter assumed to be initially relatively lightly P doped, customarily designated in the art as P− doped, but in further embodiments, high or lower resistivity material may be used or N doping and higher or lower doping levels may be used, as for example have been mentioned above. Thickness 71 (see FIG. 6) is usefully in the range of about 0.05 to 5 micrometers, more conveniently about 0.1 to 1 micrometers and preferably in the range of about 0.15 to 0.25 micrometers, but thicker and thinner layers can also be used. Width 67 (see FIG. 7) is usefully in the range of about 10 to 300 micrometers, more conveniently about 50 to 250 micrometers and preferably in the range of about 80 to 150 micrometers, but wider and narrower layers can also be used. What is important is that diode 32 formed in layer 60 be electrically floating with respect to substrate 57 (if conductive) and any common or GND terminals associated with circuit core 22 and ESD circuit 30. Hence it is placed on insulating layer 59 or other insulating substrate or region. Within poly layer 60, N+ doped regions 61-1, 61-2, 61-3, 61-4, etc., collectively 61, are provided. Interspersed between N+ regions 61 are P− regions 62-1, 62-2, 62-3, 62-4, 62-5, 62-6, etc., collectively 62, and P+ regions 63-1, 63-2, 63-3, etc., collectively 63, as shown in FIGS. 6-7. Regions 61, 63 are conveniently provided by ion implantation using conventional implant masks to define the regions where they are located. Regions 62 are conveniently formed from the background doping of as-deposited layer 60. In this situation, regions 62 are protected by a blocking mask during implantation of regions 61 and 63. However, other arrangements may also be used. Conductors 64-1 make ohmic contact to N+ regions 61 tying them together in parallel and coupling them to ESD clamp 23, and conductors 64-2 make ohmic contact to P+ regions 63 tying them together in parallel and coupling them to I/O pad 21. Thus, even though floating diode 32 has multiple P-N junctions, they are effectively in parallel and form a single diode. Where layer 60 is of poly-silicon, aluminum is a suitable material for conductors 64, but other well known interconnect conductor materials may also be used. Longitudinal widths in the left-right directions in FIGS. 6-7, of the various doped regions 61, 62, 63 and of the finger portions of conductors 64 and overall longitudinal dimension 69 will depend upon the masking resolution of the available fabrication process for forming such doped regions and the desired width for the fingers comprising conductors 64 making ohmic contact to the doped regions, upon ESD currents 33 anticipated to be passing through diode 32, the breakdown voltage $V=-V_4$, and the power being dissipated therein. Since in region 29 of FIG. 2, ESD current 33 passes through diode 32 once it begins to conduct at voltage $V=-V_4$, the power dissipation in diode 32 at voltage $V=-V_4$ can be substantial. In order to avoid thermal damage to diode 32, the overall diode area determined approximately by the product of widths 65, 69 needs to be sufficiently large that the thermal dissipation occurring during a negative going ESD event can be harmlessly conducted away through substrate 57 to whatever heat sink underlies substrate 57. As a consequence, one of the limitations of the arrangement of FIGS. 3 and 6-7, is the relatively large chip area that may be consumed by diode 32.

Figure 8:
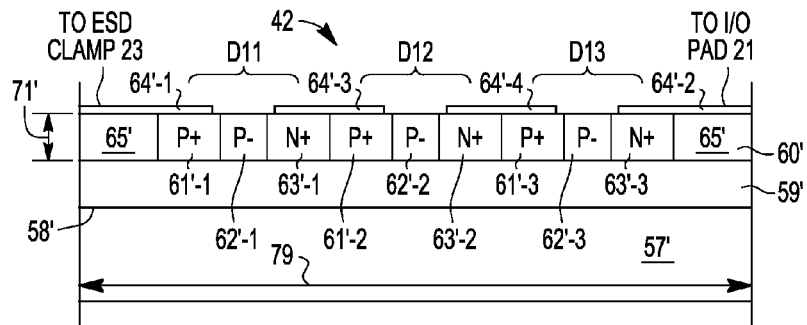
FIG. 8 is a simplified schematic cross-sectional view of a first type of floating diode such as is used in connection with the circuit of FIG. 4, according to a further embodiment of the present invention.
Figure 9:
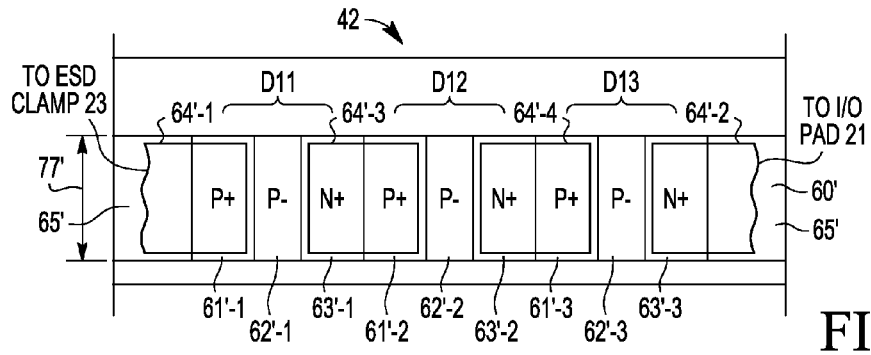
FIG. 9 is a simplified schematic plan view of the floating diode of FIG. 8.

FIG. 8 shows simplified schematic cross-sectional view 70 of floating diode string 42 used in connection with circuit 40 of FIG. 4, according to a still further embodiment of the present invention. FIG. 9 shows simplified schematic plan view 76 of floating diode string 42 of FIG. 8. Substrate 57' having upper surface 58' is provided. In many applications substrate 57' can be the SC wafer or die in and/or on which protected core 22 is formed. Where substrate 57' is conductive, dielectric layer 59' is desirably provided on upper surface 58' so as to electrically isolated diode string 42 from substrate 57'. Silicon oxide is a suitable dielectric but other organic or inorganic insulating materials may also be used. Where substrate 57' is non-conductive, layer 59' may be omitted, but for convenience of explanation it is assumed hereafter to be present. Elements 57', 58', 59', 60', 71' are analogous to elements 57, 58, 59, 60, 71 illustrated in FIGS. 6-7 but may differ somewhat in size, shape, arrangement, doping and conductivity. Semiconductor layer 60' of thickness 71' and width 77' (see FIG. 9) is formed on dielectric layer 59' by any convenient deposition process, such as have been discussed in connection with FIGS. 6-7. Poly-silicon has been found to be suitable for SC layer 60' and is preferred, but other organic and inorganic semiconductor materials can also be used, as indicated in connection with FIGS. 6-7. Layer 60' is usefully doped in the range of about 1E16 to 1E19 cm$^{-3}$, more conveniently in the range of about 1E17 to 2E18 cm$^{-3}$ and preferably in the range of about 2E17 to 1E18 cm$^{-3}$, but lower or higher doping can also be used, the choice depending upon the electrical properties desired for diodes 42. For purposes of illustration and not intended to be limiting, SC layer 60' is hereafter assumed to be initially relatively lightly P doped, customarily designated in the art as P− doped, but in further embodiments, high resistivity material may be used or N doping may also be used and higher or lower doping levels, as explained above in connection with FIGS. 6-7. Thickness 71' is usefully in the range of about 0.05 to 5 micrometers, more conveniently about 0.1 to 1.0 micrometers and preferably in the range of about 0.15 to 0.25 micrometers, but thicker and thinner layers can also be used, and width 77' of FIGS. 8-9 can generally be smaller than width 67 of FIGS. 6-7. What is important is that diode string 42 formed in layer 60' be electrically floating with respect to substrate 57' (if conductive) and any common or GND terminal associated with circuit core 22 and ESD circuit 40. Within poly layer 60', P+ doped regions 61'-1, 61'-2, 61'-3 . . . 61'-N, collectively 61', are provided. Interspersed between P+ regions 61' are P− regions 62'-1, 62'-2, 62'-3, . . . 62'-N, collectively 62', and N+ regions 63'-1, 63'-2, 63'-3 . . . 63'-N, collectively 63', as shown in FIG. 8. Ion implantation is a preferred means for doping regions 61', 63' through appropriate conventional implant masks to define the lateral geometry, and regions 62' are conveniently of the background as-deposited doping of layer 60'. As noted in connection with FIGS. 6-7, a blocking mask is conveniently used to protect regions 62' during implant doping of regions 61', 63'. Regions 61'-1, 62'-1, 63'-1 form diode D11 of FIG. 4, regions 61'-2, 62'-2, 63'-2 form diode D12, regions 61'-3, 62'-3, 63'-3 form diode D13, and so forth. While only three diodes D11, D12 and D13 are shown in FIGS. 4 and 8-9, persons of skill in the art will understand that any number N can be formed in the same way. P+ region 61'-1 has thereon conductive ohmic contact electrode 64'-1 electrically coupled to ESD clamp 23, N+ region 63'-3 has thereon ohmic contact electrode 64'-2 electrically coupled to I/O pad 21, N+ region 63'-1 is shorted to P+ region 61'-2 by conductive ohmic contact electrode 64'-3 and N+ region 63'-2 is shorted to P+ region 61'-3 by conductive ohmic contact electrode 64'-4, wherein conductive electrodes 64'-1 . . . 64'-4 are collectively referred to as conductive electrodes 64'. Conductive electrodes 64' may be of any conductive material adapted to make ohmic contact to the various regions listed above and couple them as described to each other and to ESD clamp 23 and I/O pad 21. Where layer 60' is of poly-silicon, aluminum is a suitable conductive material, but other well known interconnect materials may also be used.

Figure 10:
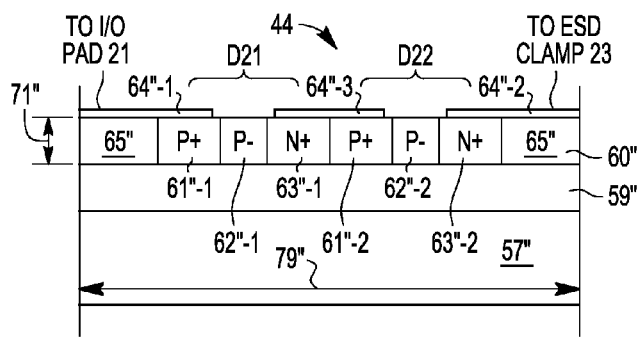
FIG. 10 is a simplified schematic cross-sectional view of a second type of floating diode such as is used in connection with the circuit of FIG. 4, according to a still further embodiment of the present invention.
Figure 11:
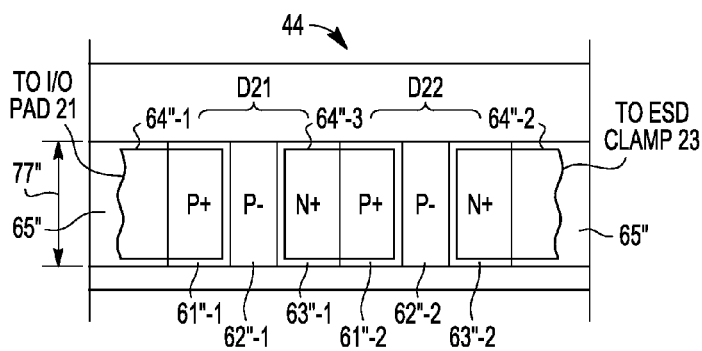
FIG. 11 is a simplified schematic plan view of the floating diode of FIG. 10.

FIG. 10 shows simplified schematic cross-sectional view 80 of floating diode string 44 such as is used in connection with circuit 40 of FIG. 4, according to a still further embodiment of the present invention, and FIG. 11 shows simplified schematic plan view 86 of floating diode string 44 of FIG. 10. Substrate 57" having upper surface 58" is provided. In many applications substrate 57" can be the SC wafer or die in and/or on which protected core 22 is formed. Where substrate 57" is conductive, dielectric layer 59" is provided on upper surface 58" so as to electrically isolated diode string 44 from substrate 57". Silicon oxide is a suitable dielectric but other organic or inorganic insulating materials may also be used, as has already been discussed in connection with FIGS. 6-9. Where substrate 57" is non-conductive, layer 59" may be omitted, but for convenience of explanation it is assumed hereafter to be present. Elements 57", 58", 59", 60", 71" are analogous to 57', 58', 59', 60', 71' illustrated in FIGS. 8-9 but may differ somewhat in size, shape, arrangement, doping and conductivity. Semiconductor layer 60" of thickness 71" and width 77" (see FIG. 11) analogous to thickness 71' and width 77' of FIGS. 8-9, is formed on dielectric layer 59" by any convenient deposition process. The properties, doping and dimensions of poly layer 60" are analogous to those of poly layer 60' of FIGS. 8-9 and the discussions thereof in connection with FIGS. 6-9 are incorporated herein by reference. Within poly layer 60", P+ doped regions 61"-1, 61"-2, . . . 61"-M, collectively 61", are provided. Interspersed between P+ regions 61" are P− regions 62"-1, 62"-2, . . . 62"-M, collectively 62", and N+ regions 63"-1, 63"-2, . . . 63"-M, collectively 63", as shown in FIG. 10. Regions 61"-1, 62"-1, 63"-1 form diode D21 of FIG. 4 and regions 61"-2, 62"-2, 63"-2 form diode D22, and so forth. Regions 61", 62", 63" are analogous to regions 61', 62', 63' of FIGS. 8-9 and discussion thereof is incorporated herein by reference. While only two diodes D21 and D22 are shown in FIGS. 4 and 10-11, persons of skill in the art will understand that any number M can be formed in the same way. P+ region 61"-1 has thereon conductive ohmic contact electrode 64"-1 electrically coupled to I/O pad 21, N+ region 63"-2 has thereon ohmic contact electrode 64"-2 electrically coupled to ESD clamp 23, N+ region 63"-1 is shorted to P+ region 61"-2 by conductive ohmic contact electrode 64"-3, wherein electrodes 64"-1 . . . 64"-3 are collectively referred to as conductive electrodes 64". Conductive electrodes 64" may be of any conductive material adapted to make ohmic contact to the various SC regions listed above and couple them to each other and ESD clamp 23 and I/O pad 21 as indicated, and otherwise have properties analogous to those previously discussed for conductive electrodes 64 and 64' of FIGS. 6-9, which discussions are incorporated herein by reference.

As has been previously explained, diode strings 42,44 of FIGS. 4 and 8-11 conduct in the forward direction and are never reverse biased into breakdown during normal ESD protection events. Thus, the energy dissipated in diodes 42,44 by currents 43 and 45 respectively is much smaller than, for example, the energy dissipated by current 33 in reverse biased floating diode 32 of FIGS. 3 and 6-7. For example, during a negative going ESD event, if $|V_4|$ is of the order of 15-17 volts, and $|V_6|$ is of the order of 3-4 volts, diode 32 of circuit 30 of FIG. 3, while effective in avoiding signal clipping at I/O pad 32 for the negative going ESD event, may dissipate 4-5 times the power at the same ESD discharge current as occurs with diodes 42 of circuit 40 of FIG. 4. As a consequence, the area occupied by diode strings 42,44 can be smaller than the area occupied by diode 32 by a similar ratio. In this respect widths 77', 77" of FIGS. 9 and 11 can generally be made significantly smaller than width 67 of FIG. 7. This is a great advantage since the cost of manufacture is, other things being equal, directly related to the chip area; the larger the chip area (e.g., because of larger ESD devices) the higher the unit cost. While the voltage margin for avoiding signal clipping at I/O pad 21 can be smaller with the arrangement of circuit 40 of FIGS. 4 and 8-10 as compared to that for circuit 30 of FIGS. 3 and 6-7, it is always better than that obtained from prior art ESD circuit 20 of FIG. 1 and in many cases can be more than adequate. Thus, the arrangement of FIGS. 4 and 8-11 is advantageous and a significant advance over the prior art.

It will be noted in connection with FIGS. 8-9 and 10-11, that the diode strings formed by the sequence of P and N regions in layers 60', 60" have an odd number of PN junctions therein. Stated another way, if there are N diodes in layer 60' of FIGS. 8-9, there are N+(N−1) PN junctions therein of which (N−1) are shorted together, as for example, by metal regions 64'-3, 64'-4, etc. Similarly, if there are M diodes in layer 60" of FIGS. 10-11, there are M+(M−1) PN junctions therein of which (M−1) are shorted together, as for example, by metal regions 64"-3, etc. It is useful that N≧M and preferably that N≧M+1.

According to a first embodiment, there is provided, an electronic device (40) having input/output (I/O) (21) and common terminals (24), comprising, a circuit core (22) coupled between the I/O (21) terminal and the common (24) terminal, at least one substantially asymmetric electro-static discharge (ESD) clamp (23) having first and second terminals, wherein the first terminal is coupled to one of the I/O (21) terminal or the common (24) terminal, and two opposed floating diode strings (42, 44) each having therein one or more diodes, parallel coupled to third and fourth terminals, wherein the third terminal is coupled to the second terminal of the ESD clamp and the fourth terminal is coupled to the other of the I/O (21) terminal or the common (24) terminal. According to a further embodiment, a first (42) of the two opposed floating diode strings (42, 44) has therein N diodes and a second (44) of the two opposed floating diode strings (42, 44) has therein M diodes, and N≧M. According to a still further embodiment, a first (42) of the two opposed floating diode strings (42, 44) has therein N diodes and a second (44) of the two opposed floating diode strings (42, 44) has therein M diodes, and N≧M+1. According to a yet further embodiment, N≦12.

According to a still yet further embodiment, M<6. According to a yet still further embodiment, the two opposed floating diode strings (42, 44) are formed in a polycrystalline semiconductor (60', 60"). According to another embodiment, the polycrystalline semiconductor (60', 60") comprises silicon. According to a still another embodiment, the device (40) further comprises a common substrate (57', 57") on or in which the circuit core (22) and the electrostatic discharge clamp (23) are formed, and on which the two opposed floating diode strings (42, 44) are formed. According to a yet another embodiment, the substrate (57', 57") is conductive and further comprising an insulating layer (59', 59") interposed between the two opposed floating diode strings (42, 44) and the conductive substrate (57', 57"). According to a still yet another embodiment, at least one of the two opposed floating diode strings (42, 44) formed in the polycrystalline semiconductor layer (60', 60"), comprises, a sequence of N (63', 63") and P (61', 62'; 61", 62") regions having an odd number of PN junctions. According to a yet still another embodiment, the number of PN junctions is N+(N−1) where N is the number of diodes comprising the diode string (42).

According to a second embodiment, there is provided a method for forming an electronic element (40), comprising, providing a substrate (57', 57") on or in which has been formed a core circuit (22) having first (21) and second (24) terminals desired to be protected from electrostatic discharge (ESD) events and an asymmetrical ESD protection device (23) having third and fourth terminals, the substrate (57', 57") having an insulating first surface region (59', 59"), depositing on the first surface region (59', 59") of the substrate (57', 57") a polycrystalline semiconductor (PSC) layer (60', 60"), in a first portion (70) of the PSC layer (60', 60"), forming N diodes by localized doping of the PSC layer (60', 60"), wherein the PSC layer (60', 60") has therein N+(N−1) PN junctions of which (N−1) are shorted together, in a second portion (80) of the PSC layer (60', 60"), forming M diodes by localized doping of the PSC layer (60', 60"), wherein the PSC layer (60', 60") has therein M+(M−1) PN junctions of which (M−1) are shorted together, and electrically coupling the N diodes and M diodes in opposed parallel configuration between the first terminal (21) of the core circuit (22) and the third terminal of the ESD protection device (23) and coupling the fourth terminal of the ESD protection device to the second terminal (24) of the core circuit (22). According to a further embodiment, M≦N. According to a still further embodiment, N≦12 and M≦6. According to a still further embodiment, the PSC layer (60', 60") is formed by chemical vapor deposition (CVD) or plasma enhanced CVD of a combination thereof. According to a yet further embodiment, the PSC layer (60', 60") has an initial doping concentration less than that of P (61', 62'; 61", 62") and N (63', 63") regions subsequently provided by localized doping thereof to form the PN junctions.

According to a third embodiment, there is provided an electronic element having an electrostatic discharge (ESD) protection circuit (40) for minimizing clipping of signals presented between an input-output (I/O) terminal (21) and a reference terminal (24) of a core circuit (22) intended to be protected from ESD events occurring between the I/O terminal (21) and reference terminal (24), comprising, an asymmetrical ESD protection device (23) providing forward conduction for a first current direction (43) and ESD clamping for a second, opposite, current direction (45), opposed parallel coupled strings of diodes (42, 44) serially coupled to the ESD protection device (23) to form a combination, wherein a first (42) of the opposed parallel coupled strings has N serially arranged diodes therein and provides forward conduction for the first current direction (43) and a second (44) of the opposed parallel coupled strings has M serially arranged diodes therein and provides forward conduction for the second, opposite, current direction (45), and wherein the combination is coupled between the I/O (21) and reference (24) terminals. According to a further embodiment, N≧M. According to a still further embodiment, N≧M+1. According to a still yet further embodiment, the core circuit (22), the ESD device (23) and the first (42) and second (44) diode strings are formed in or on a common substrate (57', 57") so that the diode strings (42, 44) are separated from the common substrate (57', 57") by an insulating region (59', 59").

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic device having input/output (I/O) and common terminals, comprising:
    a circuit core coupled between the I/O terminal and the common terminal;
    at least one substantially asymmetric electro-static discharge (ESD) clamp having first and second terminals, wherein the first terminal is coupled to one of the I/O terminal or the common terminal; and
    two opposed floating diode strings formed in a polycrystalline semiconductor, each of the diode strings having therein multiple diodes coupled in series, wherein the diode strings are parallel coupled to third and fourth terminals, wherein the third terminal is coupled to the second terminal of the ESD clamp and the fourth terminal is coupled to the other of the I/O terminal or the common terminal, and wherein a first diode string of the two opposed floating diode strings comprises a first plurality of diodes coupled in series, wherein a first diode of the first plurality of diodes includes a first region of a first conductivity type and a first doping density, a second region of the first conductivity type directly adjacent the first region and having a second doping density that is less than the first doping density, and a third region of a second conductivity type directly adjacent the second region, and wherein a second diode of the first plurality of diodes includes a fourth region of the first conductivity type directly adjacent the third region and having the first doping density, a fifth region of the first conductivity type directly adjacent the fourth region and having the second doping density, and a sixth region of the second conductivity type directly adjacent the fifth region, and wherein the third region of the first diode is electrically coupled with the fourth region of the second diode.

2. The device of claim 1, wherein a first of the two opposed floating diode strings has therein N diodes and a second of the two opposed floating diode strings has therein M diodes, and N≧M.

3. The device of claim 1, wherein a first of the two opposed floating diode strings has therein N diodes and a second of the two opposed floating diode strings has therein M diodes, and N≧M+1.

4. The device of claim 3, wherein N≦12.

5. The device of claim 3, wherein M≦6.

6. The device of claim 1, wherein the polycrystalline semiconductor comprises silicon.

7. The device of claim 1, further comprising a common substrate on or in which the circuit core and the electrostatic discharge clamp are formed, and on which the two opposed floating diode strings are formed.

8. The device of claim 7, wherein the substrate is conductive and further comprising an insulating layer interposed between the two opposed floating diode strings and the conductive substrate.

9. The device of claim 1, wherein at least one of the two opposed floating diode strings formed in the polycrystalline semiconductor layer, comprises, a sequence of N and P regions having an odd number of PN junctions.

10. The device of claim 9, wherein the number of PN junctions is N+(N−1) where N is the number of diodes comprising the diode string.

11. An electronic element having an electrostatic discharge (ESD) protection circuit for minimizing clipping of signals presented between an input-output (I/O) terminal and a reference terminal of a core circuit intended to be protected from ESD events occurring between the I/O terminal and reference terminal, comprising:
    an asymmetrical ESD protection device providing forward conduction for a first current direction and ESD clamping for a second, opposite, current direction; and
    opposed parallel coupled strings of diodes serially coupled to the ESD protection device to form a combination, wherein a first of the opposed parallel coupled strings has N serially arranged diodes therein and provides forward conduction for the first current direction and a second of the opposed parallel coupled strings has M serially arranged diodes therein and provides forward conduction for the second, opposite, current direction, and the combination is coupled between the I/O and reference terminals, and wherein a first diode string of the opposed parallel coupled strings of diodes comprises a first plurality of diodes coupled in series, wherein a first diode of the first plurality of diodes includes a first region of a first conductivity type and a first doping density, a second region of the first conductivity type directly adjacent the first region and having a second doping density that is less than the first doping density, and a third region of a second conductivity type directly adjacent the second region, and wherein a second diode of the first plurality of diodes includes a fourth region of the first conductivity type directly adjacent the third region and having the first doping density, a fifth region of the first conductivity type directly adjacent the fourth region and having the second doping density, and a sixth region of the second conductivity type directly adjacent the fifth region, and wherein the third region of the first diode is electrically coupled with the fourth region of the second diode.

12. The electronic element of claim 11, wherein N≧M.

13. The electronic element of claim 12, wherein N≧M+1.

14. The electronic element of claim 11, wherein the core circuit, the ESD device and the first and second diode strings are formed in or on a common substrate so that the diode strings are separated from the common substrate by an insulating region.

15. The electronic element of claim 11, further comprising:
a substrate; and
a polycrystalline semiconductor (PSC) layer on a surface of the substrate, wherein
the N diodes are formed in a first portion of the PSC layer by localized doping of the PSC layer, wherein the PSC layer has therein N+(N−1) PN junctions of which (N−1) are shorted together, and wherein
the M diodes are formed in a second portion of the PSC layer by localized doping of the PSC layer, wherein the PSC layer has therein M+(M−1) PN junctions of which (M−1) are shorted together.

16. The electronic element of claim 15, wherein the PSC layer has an initial doping concentration less than that of P and N regions subsequently provided by localized doping thereof to form the PN junctions.

17. The electronic element of claim 11, wherein the first region comprises a P+ type region, the second region comprises a P− type region directly abutting the first region, and the third region comprises an N+ type region directly abutting the second region.

18. The electronic element of claim 11, wherein the first region comprises an N+ type region, the second region comprises an N− type region directly abutting the first region, and the third region comprises a P+ type region directly abutting the second region.

* * * * *